United States Patent [19]

Shinneman et al.

[11] Patent Number: 5,284,561
[45] Date of Patent: Feb. 8, 1994

[54] METHOD AND APPARATUS FOR SPUTTER COATING EMPLOYING MACHINE READABLE INDICIA CARRIED BY TARGET ASSEMBLY

[75] Inventors: Frank M. Shinneman, Ridgewood; Steven Hurwitt, Park Ridge, both of N.J.

[73] Assignee: Materials Research Corporation, Orangeburg, N.Y.

[21] Appl. No.: 791,415

[22] Filed: Nov. 13, 1991

[51] Int. Cl.⁵ ............................................. C23C 14/34
[52] U.S. Cl. ........................... 204/192.13; 204/298.03; 204/298.09; 204/298.12
[58] Field of Search ....................... 204/192.12, 298.02, 204/298.03, 192.13, 192.33, 298.09, 298.08, 298.12

[56] References Cited

U.S. PATENT DOCUMENTS

| | | | |
|---|---|---|---|
| 4,756,814 | 7/1988 | Van Voren et al. | 204/294 |
| 4,957,605 | 9/1990 | Hurwitt et al. | 204/192.13 X |
| 5,126,028 | 6/1992 | Hurwitt et al. | 204/192.13 |

Primary Examiner—Nam Nguyen
Attorney, Agent, or Firm—Donald F. Frei; Joseph R. Jordan

[57] ABSTRACT

An expendable target of sputter coating material is provided having secured thereto a storage medium having recorded thereon, in machine readable indicia, information relating to a characteristic of the target. The information preferably includes target identifying information and may also include information relating to the target composition, the history of the use of the target, and other information usable by the apparatus to automatically set machine parameters or to record process information. Information, particularly of the use of the target, may be updated and written to a medium on the target or target assembly, or to a machine readable medium which may be affixed to the target assembly when the target is removed. The apparatus preferably includes a read head in the sputtering chamber and may also include a write head for writing information to the target assembly. A memory and microprocessor cooperate with the machine control to utilize the information read from the target in the control of the sputtering apparatus.

23 Claims, 4 Drawing Sheets

METHOD AND APPARATUS FOR SPUTTER COATING EMPLOYING MACHINE READABLE INDICIA CARRIED BY TARGET ASSEMBLY

The present invention relates to sputter coating and more particularly to the management and use of information, in a sputter coating system, relating to the identity, characteristics and history of a sputtering target.

BACKGROUND OF THE INVENTION

Sputter coating is a process carried out in a vacuum chamber which is filled with a generally chemically inert gas in which a substrate is coated with a material from a target of sputtering material subjected to a negative electrical potential with respect to the chamber wall or other anode. The potential gradient adjacent the target surface causes electrons to be emitted from the target which, on their way to the chamber anode which is usually formed in part by the grounded chamber wall, strike and ionize some of the inert gas. The positive ions formed are then attracted to the negative target which they strike, transferring momentum to the target material, and ejecting particles of the material from the target surface. The substrate to be coated, which is positioned in the chamber usually with its surface facing the target, receives some of the ejected particles which adhere to and coat the substrate surface.

Magnetron sputtering is a sputter coating process in which a magnetic field is formed over the target surface, usually including magnetic field lines parallel to the target surface, and, in many applications, in the form of a closed magnetic tunnel. The magnetic field causes the electrons emitted to move in curved spiral paths which trap them in regions proximate the target surface enclosed by the field, thereby increasing the rate of electron collisions with gas atoms, which in turn increase the ionization of the gas and the efficiency of the sputtering process.

In magnetron sputter coating processes, the sputtering of materials from the sputtering target occurs most rapidly into regions of the target where the plasma trapped by the magnetic field is the most dense. This causes the proportionate consumption or erosion of the sputtering material from the target surface. The erosion of sputtering material from other portions of the sputtering target surface generally occurs at a rate which varies in proportion to the strength and/or duration of the plasma over that portion of the target surface. Such erosion of the target at different rates across the target surface is sometimes desirable to achieve, for example, uniform coating of the substrate, as for example is described in the commonly assigned U.S. Pat. No. 4,957,605, hereby expressly incorporated herein by reference.

The shape of a sputtering target as well as its composition determine the operating parameters of the sputtering machine, such as the sputtering power levels, the characteristics of the magnetic fields over the target, the gas composition and pressure within the sputtering chamber, the sputtering process time, and other factors, to which the machine must be set for operation. The shape of the sputtering target varies with the use of the target as the target erodes. The history of the use of the target and of the parameter settings over the course of the history of the target affect the characteristics of the target, including particularly its shape, at any point in the life of the target. Thus, parameter settings for optimal use of the target at any point in time will vary with the history of the use of the particular target. In addition, variations from target to target, such as variations in composition, texture or crystal structure, may require different adjustments in operating parameters of the machine for optimal performance of the sputter coating process. Such adjustments will be experienced as the target is used. Furthermore, the identity of the particular target and information regarding its composition and history of use will, in some cases, be important in evaluating the coated products produced with the sputtering target at any point in its life. This is particularly important targets are replaced and when targets which have been previously used are installed in a sputtering machine. The use of information regarding the parameters associated with the sputtering process, are discussed in the commonly assigned and copending U.S. patent application Ser. No. 07/570,943, filed Aug. 22, 1990, now U.S. Pat. No. 5,126,028 entitled "Sputter Coating Process Control Method and Apparatus", hereby expressly incorporated herein by reference.

The use of information regarding the identity, characteristics and history of the sputtering target, and the correlation of that information with the products produced by the target has, in the prior art, been a manual process. Similarly, proper settings of the operating parameters of the machine have required manual decision making by the machine operator. Accordingly, the prior art has provide inadequate utilization of information regarding the target, and has provided inefficiency and a risk of error.

Accordingly, there is a need to provide a method and apparatus for effectively maintaining and utilizing information regarding the sputtering target in a sputter coating process.

SUMMARY OF THE INVENTION

It is an objective of the present invention to provide a sputtering coating method and apparatus in which information relating to the specific target present at any point in time in a processing chamber of sputter coating machine is immediately and reliably available. It is a more particular objective of the present invention to make available information relating to the identity, characteristics or history of a sputtering target which is installed in the processing chamber of a sputter coating machine.

According to the principles of the present invention, there is provided a sputtering target assembly having machine readable indicia recorded on a medium carried by an expendable target or portion of the target assembly which is removable with the target. A sputter coating apparatus has a sputtering chamber, in which the target is supported, having a sensor or reader for reading information from the medium.

In the preferred embodiment of the invention, the indicia is coded with unique target identifying information, such as a serial number, which identifies the target and may be correlated with information stored in a memory of the apparatus relating to the characteristics of the target, its composition and/or its history of use. In the alternative, the information coded on the medium may include information of the composition or other characteristics of the target, and may also include the history of the use of the target.

In its alternative embodiments, the medium may be a read only memory which is suitable for recording the target identifying information or the unchanging characteristics of the target such as the target composition. The medium may also be a read/write memory which is suitable for recording information such as target history, which may be updated after each run by writing devices within the sputtering machine in which the target is being used, or may carry date, time, batch number or other such information. Alternatively, a storage medium may written or coded in machine readable form at a location remote from the sputtering chamber and then affixed to the target, the target backing plate, or other structure to which the target is bonded or otherwise secured, when the target is removed from the apparatus.

Where the sputtering material of the target is alone removable for replacement, it is preferable that the medium be carried upon the sputtering material of the target so that it cannot be separable therefrom and is destroyed when the remaining material of the target is recycled at the end of the target life. On the other hand, where the target material is formed and bonded to a nest or backing plate which is removable with the target for replacement, the medium may be carried by the backing plate. In such a case, the medium should be such as to be destructible in the process by which the target material is removed from or bonded to the backing plate so that new information can be coded onto the assembly which corresponds to the new target material.

Further according to principles of the present invention, the sputtering process is preferable carried out by providing a target with coded indicia recorded thereon, in a read-only medium, which uniquely identifies the target and which, in addition, carries information of certain unchangeable data such as the composition of the target or the target design or type. A read head in the apparatus is fixed in the sputtering chamber to read the information from the indicia. The head is connected to circuitry for storing the information in a memory in the machine. A read/write medium on the target contains further information regarding the history of the use of the target, and initially is set to indicate that the target is new. A read/write head in the apparatus is positioned to read information from the read/write medium and to rewrite the information in updated form to indicate the usage put on the target while in the apparatus. Thus, if the target is removed and later reinstalled in the same or another apparatus equipped with features for reading the recorded information, an accurate up-to-date record of the history of the use of the target, and thus information to determine the condition of the target, is available to the sputtering machine. The apparatus preferably includes a microprocessor capable of using the information for analysis of the process or control of the apparatus.

According to the preferred embodiment of the invention, the indicia carrying medium is situated on the back of the target or backing plate to which the target is bonded to be read from or written to from behind the target holder outside of the environment of the sputtering chamber.

These and other objectives and advantages of the present invention will be more readily apparent from the following detailed description of the drawings in which:

BRIEF DESCRIPTION OF THE DRAWINGS

FIG. 1A is an enlarged view of an alternative embodiment of the encircled portion A of FIG. 1.

DETAILED DESCRIPTION OF DRAWINGS

Sputtering machines of the type to which the present invention relates are described in the following commonly assigned U.S. patents and copending patent applications which are hereby expressly incorporated in their entirety into this application by reference:

U.S. Pat. Nos. 4,909,695 and 4,915,564 entitled "Method and Apparatus for Handling and Processing Wafer-Like Materials";

U.S. patent application Ser. No. 07/339,308, filed Apr. 17, 1989, now U.S. Pat. No. 4,957,605, entitled "Method and Apparatus for Sputter Coating Stepped Wafers"; and U.S. patent application Ser. No. 07/606,701, filed Oct. 31, 1990, abandoned.

The preferred embodiment of the present invention is set forth herein as the sputtering target and cathode assembly of U.S. patent application Ser. No. 07/606,701 incorporated by reference above, as illustrated in most pertinent part in FIGS. 1 and 2.

Figure 1:
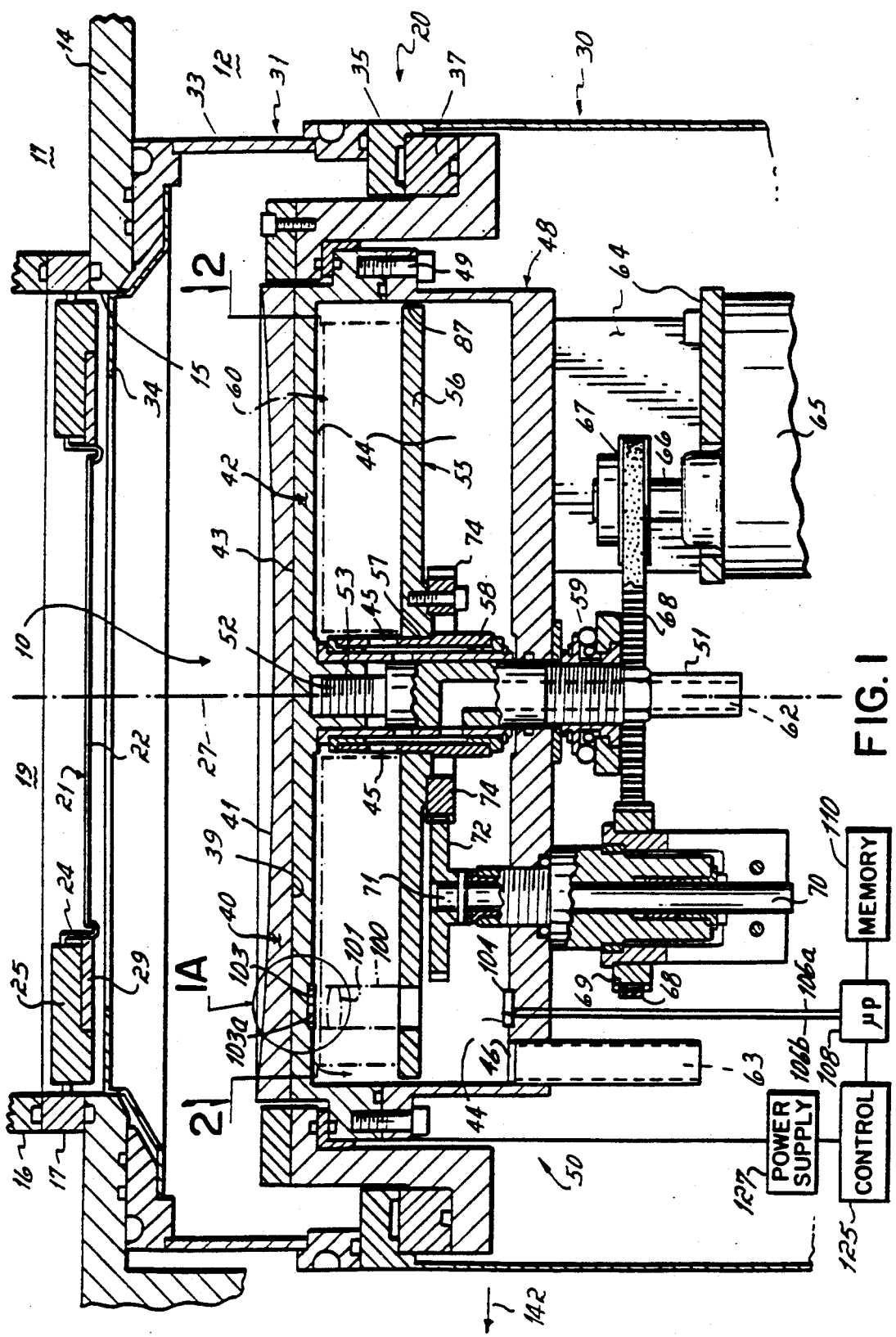
FIG. 1 is a cross-sectional view through a target assembly of one preferred embodiment of an apparatus embodying principles of the present invention.

Referring to FIG. 1, there is shown in cross-section a sputter coating processing chamber 10 of a sputter coating apparatus according to principles of the present invention. The chamber 10 is a portion of the sputter processing apparatus disclosed in U.S. Pat. No. 4,909,695. The processing chamber 10 is a vacuum processing chamber formed of an isolated section of a main chamber 11. The main chamber 11 is isolated from the atmosphere of the machine environment 12 by a plenum wall 14. The processing chamber 10 is capable of communicating with the main chamber 11 throughout opening 15 (shown sealed) in the plenum wall 14.

As more fully described in U.S. Pat. No. 4,909,695, the sealing of the opening 15 isolates the chamber 10 from the main processing chamber 11 by the selective movement of a processing chamber backplane section 16 against a portion of a disk shaped rotary wafer transport member 17 clamping the transport member 17 between the backplane section 16 and the plenum wall 14 in a sealing relationship (as shown), thereby enclosing a backplane space 19 within the processing chamber 10 and isolating the processing chamber 10 from the main chamber 11.

Opposite the backplane section 16, on the front plane side of the transport member 17, the processing chamber 10 is isolated from the machine environment 12 with a cathode assembly module 20 mounted in a vacuum sealing relationship against the plenum wall 14 surround the opening 15. The module 20, or processing chamber frontplane section, cooperates with the backplane section 16 and the transport member 17 to form the sealed isolated processing chamber which is isolated from both the main chamber 11 and the machine external environment 12.

Within the processing chamber 10 is a substrate or workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. The transport member portion 17 is a transversely movable ring carried by a rotatable index plate which is not shown, but described more fully in the above incorporated U.S. Pat. Nos. 4,909,675 and 4,915,564.

In this preferred embodiment, the wafer 21 is supported in a plane perpendicular to, and concentric with, a central axis 27 of the main chamber 10, which is also concentric with the hole 15 in the plenum wall 14. Surrounding the wafer 21 on the holder 25 is a disk 29 which at least partially protects the holder 25 from an excessive accumulation of coating intended for but which missed, the surface 22 of the wafer 21. Details of the sputtering apparatus of which the processing chamber 10 is a part including particularly details of the wafer transport 17, wafer holder 25, and backplane section 16, are described and illustrated in U.S. Pat. Nos. 4,909,695 and 4,915,564 incorporated by reference above.

The cathode assembly module 20 includes two assemblies, a removable cathode assembly 30 and a fixed assembly portion 31. The fixed assembly portion 31 is an annular enclosure rigidly mounted in sealed relationship against the plenum wall 14 surrounding the opening 15. It includes a cylindrical metal side wall 33 of the chamber 10, which is electrically grounded to the frame 14 of the plenum, a wafer holder shield 34 which surrounds the opening 15 and a chamber door frame assembly 35.

The cathode assembly 30 is mounted to a hinged door assembly 37 which removably but sealably supports the cathode assembly 30 to the fixed assembly 31. The cathode assembly 30 carries the sputtering target 40, which is a circular target having a continuous smooth concave sputtering surface 41 and a back surface 39. The assembly 30 supports the target 40 with its axis in alignment with the axis 27 of the chamber 10 and with its sputtering surface 41 facing the surface 22 of the wafer 21 to be coated.

The target 40 is supported in a target nest 42 having a front surface 43 conforming to surface 39 and concentric with axis 27. The back surface 39 of the target 40 is soldered or otherwise bonded to the front surface 43 of the nest 42, in intimate thermal contact therewith. The target back surface 39 is a cooling surface which, when the target 40 is mounted in holder 42, conforms to and lies in close cooling contact with the surface 43 of the holder 42. Behind the nest 42, opposite the cooling surface 43 thereof, is a space 44 for the circulation of cooling liquid, which is generally water, to remove heat generated in the target 40 during sputtering by cooling the heat conductive target holder 42. The cooling fluid is circulated into and out of the space 44 from an inlet port 45 to an outlet port 46 in a magnet assembly 50, as described below. The space 44 is enclosed behind the nest 42 by a housing structure 48 onto which the nest 42 is rigidly supported, and to which it is secured by bolts 49.

The shapes of the surfaces of the target 40 are preferably such that all the target 40 is capable of being formed by turning block of sputtering material on a lathe. The target holder 40 is made of a heat conductive and electrically conductive material, preferably hard tempered OFHC copper or Alloy 110.

The magnet assembly 50 includes a shaft 51 having a threaded end 52 by which the shaft 51 is rigidly mounted in a threaded bore 53 at the center of the back surface of the nest 42. The assembly 50 also includes a rotatable magnet carrier assembly 55 which includes a circular disk 56 of non-magnetic stainless steel or other such material having a central hole 57 therein at which the disk 56 is rigidly mounted to a sleeve assembly 58 rotatably mounted through a bearing assembly 59 through the housing 48 and to the nest 42 to rotate about the shaft 51 on the axis 27. The rotatable magnet assembly further includes a magnet structure 60 rigidly mounted on the disk 56 to rotate therewith. The magnet 60 surrounds the axis 27 and lies beneath or behind the nest 42, opposite the front surface 43 thereof, and close enough thereto to generate a closed magnetic field above the sputtering surface 41 of the target 40 mounted on the surface 43 of the nest 42.

The shaft 51 has a cooling fluid inlet duct 62 extending therethrough which communicates with the inlet port 45 to the interior cooling chamber 44 between the nest 42 and the housing 48. The housing 48 has mounted near the edge thereof a cooling fluid outlet duct 63 which communicates with the fluid outlet port 46 in the cooling space 44.

Mounted to the back of the housing 48 is a bracket 64 to which is mounted a magnet rotary drive motor 65. The motor 65 has an output shaft 66 with a cogged drive wheel 67 mounted at the end thereof for driving a cogged drive belt 68. The belt 68 extends around a cogged drive wheel 69 attached to a drive shaft 70 which is rotatably mounted on the housing 48 extending therethrough and having a free end 71 to which is mounted a drive gear 72. The drive gear 72 is positioned within the space 44 where it engages a mating gear 74 attached to the disk 56 of the rotatable magnet assembly 55. Accordingly, the motor 65, when energized, rotates the magnet assembly 55 to rotate the magnet 60 behind the target nest 42 to rotate the magnetic field over the sputtering surface 41 of the target 40. The details of the construction of the magnet structure 60 and its arrangement on the magnet assembly 55 can be better understood by reference to FIGS. 2-4.

Figure 2:
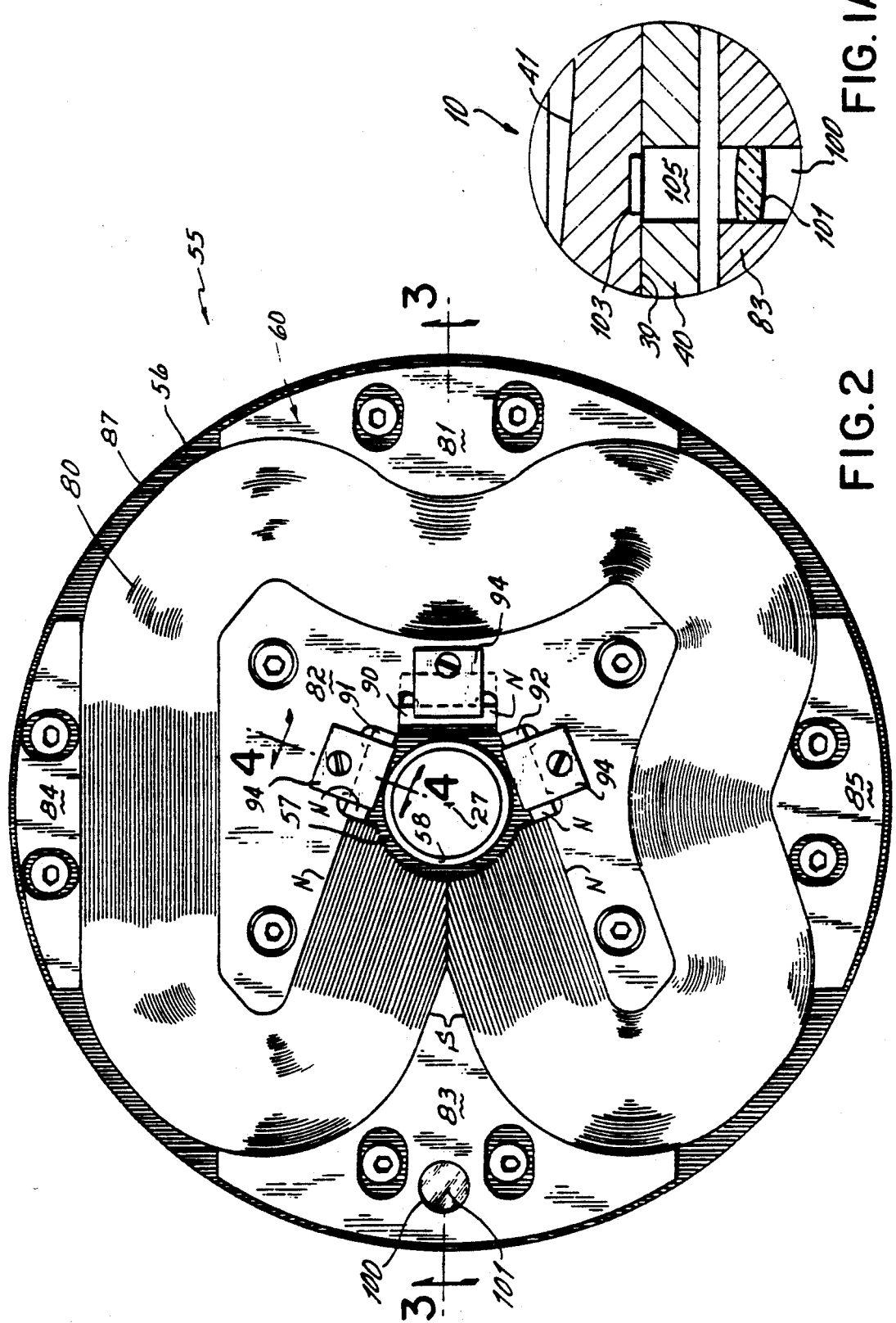
FIG. 2 is a view taken generally along lines 2—2 of FIG. 1 illustrating the face of the rotatable plate and magnet assembly.

Referring to FIG. 2, according to one preferred embodiment of the present invention, the magnet structure 60 is shown supported on the disk or plate 56. The magnet structure 60 is a strip of flexible magnet impregnated plastic made up of a laminated plurality of flexible plastic magnetic ribbons 80, for example 24 in number, arranged in a closed irregular loop on the plate 56. The shape of the magnet 80 is selected such that, as the magnet rotates, the strength and duration of the plasma at any given radius of the target will cause sputtering at a predetermined desired average rate necessary to produce a desired coating distribution on the target. The thickness of the target 40 is further varied across the radius of the target to supply material in proportion to the demands of the sputtering distribution.

The ribbon magnet 80 is held in place in a particular predetermined shape surrounding axis 27 by five clamping blocks 81-85. The ribbons of the magnet 80 are polarized in such a way that one pole of the magnet formed thereby faces outwardly toward the outer rim 87 of the disk 56 and toward the clamping blocks 81, 83, 84 and 85, while the other pole faces inwardly toward the clamping block 82. In the particular embodiment illustrated, each of the ribbons has its north pole facing inwardly and its south pole facing outwardly.

Mounted to the clamping block 82 and positioned about the central axis 27 are three permanent magnets 90, 91 and 92 which are held to the block 82 by clamps 94. Each of the magnets 90, 91 and 92 is oriented with its north pole facing in the general direction toward the target nest with its south pole facing generally toward the plate 56. In the particular embodiment illustrated, the north pole of magnet 90 is inclined at an angle of approximately 45 degrees toward the central axis 27 while the magnets 91 and 92 are oriented parallel to the axis 27.

Figure 3:
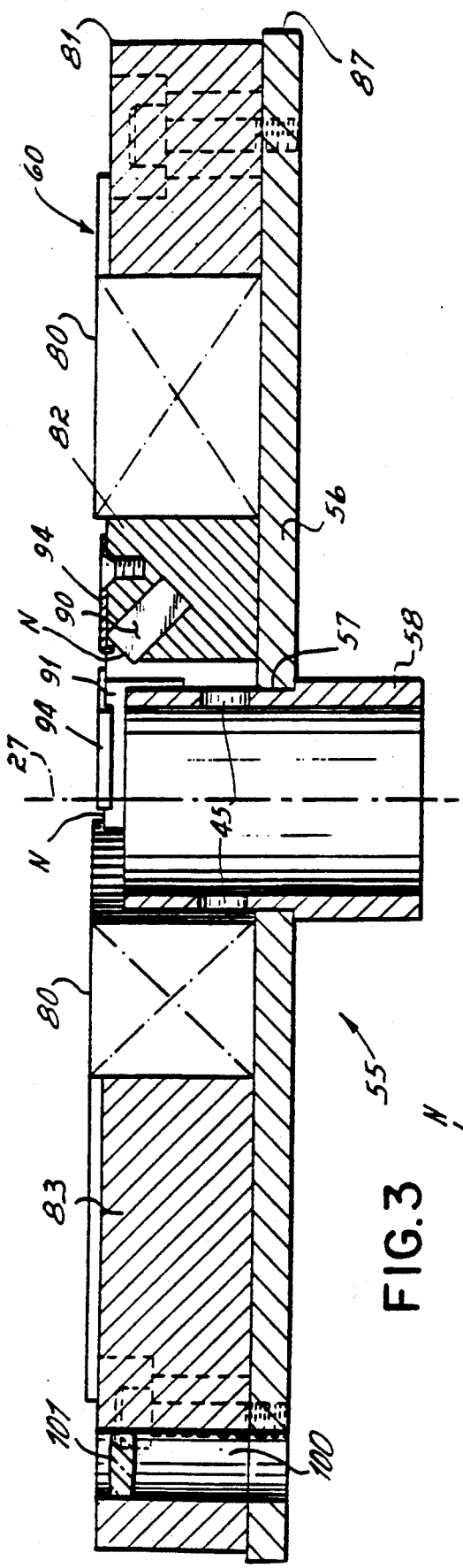
FIG. 3 is a cross-sectional view along line 3—3 of FIG. 2.
Figure 4:
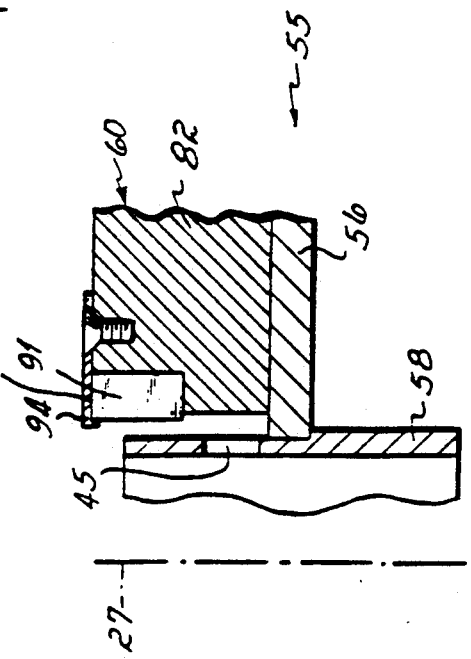
FIG. 4 is a fragmentary cross-sectional view along line 4—4 of FIG. 2.

Referring to FIGS. 1-3, the magnet assembly 55 has extending therethrough a hole 100, which may be an filled with an optically transparent lens 101, in the clamping block 83 and the plate 56. Secured to, and embedded so as to be flush with, the back of the target nest 42 so as to align with the whole 100, when in one angular position, is a read-only medium carrying indicia, such as an optically readable bar-code 103. In the housing 48, opposite the bar-code 103, is a conventional bar-code reading head or 104, which may include a laser light source and receiver. The lens 102 may be such as to scan the bar code to transmit the laser light to and from the bar-code 103 so as to be read by the sensor of the reader 104.

In the alternative embodiment of FIG. 1A, the medium carrying the bar-code 103 is carried directly by the target 40 on the back surface 39 thereof. In this embodiment, a hole 105 is provided in the nest 42 to expose the bar code 103 to be viewed from behind the nest 42.

The sensor of the reader 104 has an output 106 connected to an input of a microprocessor 108 which is, in turn, provided with a bus connected to a memory 110. The information on the bar code is, in one embodiment, a serial number of the target 40. In the memory 110 is stored, in this embodiment, information regarding the composition of the target and data regarding the history of the target 40 and of other targets correlated with the respective targets by serial number. Controls 125 of the apparatus may be connected to an output of the microprocessor 108 which, through a control program, may respond to the composition and history data stored in the memory 110. In this way, the control 125 may, with outputs connected to a target power supply 127, for example, control parameters of the process such as the power applied to the target during the sputtering operation, all as more particularly described in the above incorporated patent application Ser. No. 07/570,943, now U.S. Pat. No. 5,126,028.

In other embodiments, the bar code 103 may contain information such as the target composition or target power limits.

In further alternative embodiments, a non-volatile read/write medium 103a is provided in place of, or in addition to, the bar-code 103. In such an embodiment, a read/write head 104a is provided in place of, or in addition to, the bar-code reader 104, and connected to input-/output ports of the microprocessor 108 through lines 106a. With the medium 103a and reader 104a, data such as the history of the usage of the target in the apparatus, as, for example, power applied to the target, total energy consumed by the target, processing time, the date and time of the processing operation, the batch numbers or other wafer identification information, may be stored by the head 104a on the medium 103a.

The indicia recording media 103,103a affixed to the target 40 is in a form that will be destroyed by the bonding process by which a new target is attached to the backing plate 42. For example, a bar code may be written with ink that fades at a temperature required for bonding a target to the backing plate by soldering, should that be the bonding method employed. Alternatively, the medium may be made of a material that will melt at the bonding temperature, or may be affixed to a structure that will be mechanically destroyed in bonding or debonding of a target.

Figure 5:
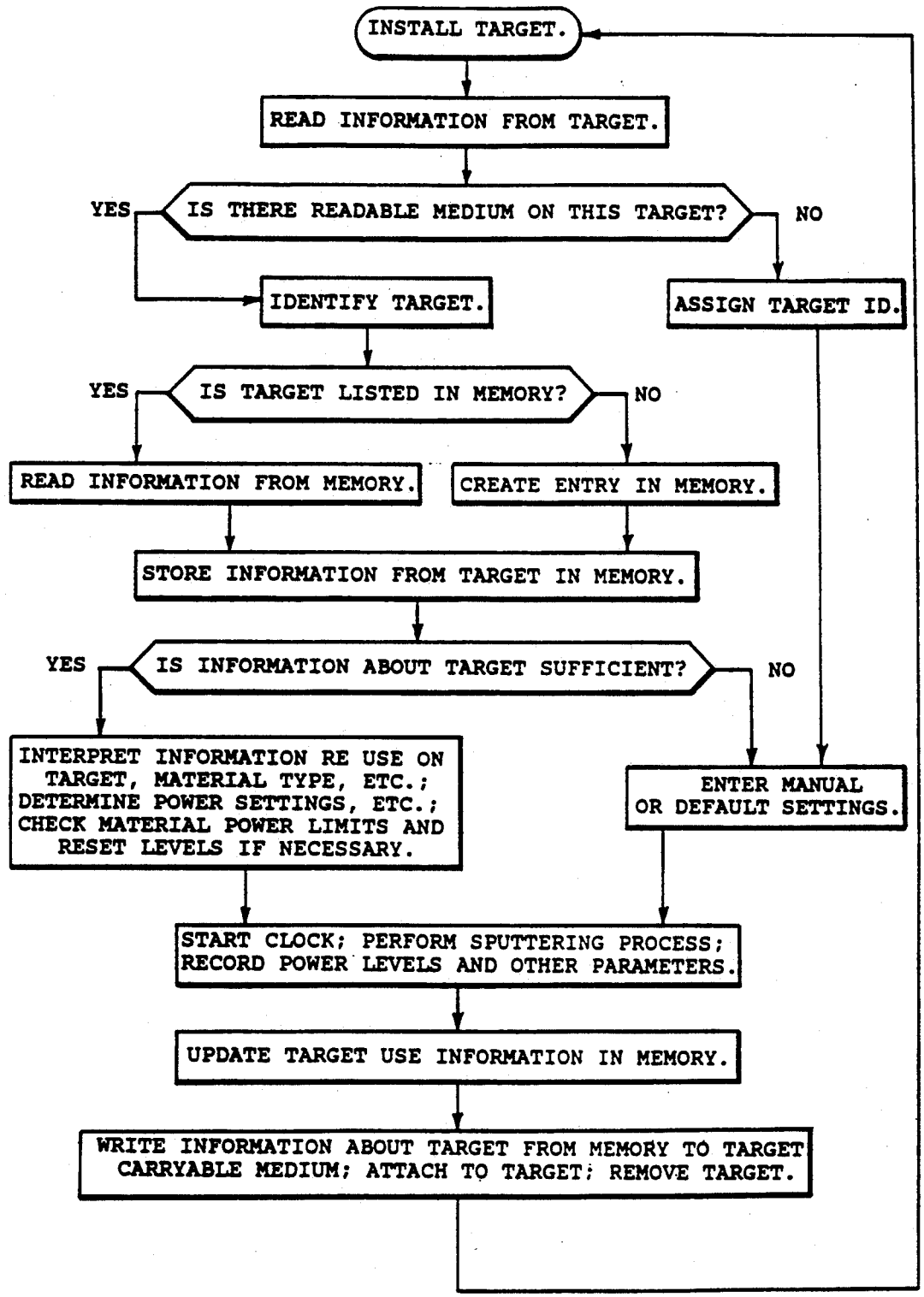
FIG. 5 is a flow chart of one preferred embodiment of the operation of the apparatus of FIG. 1.

The operation of the invention will be best understood by reference to FIG. 5, which is a flow chart of the operation of the microprocessor 108 and control 125 according to one embodiment of the invention. Upon or following the installation of a target, the indicia affixed to the target or backing plate is caused to be read. Then the information, if any, that is read is tested to determine whether there is in fact machine readable indicia carried by the target. If there is none, some unique identification is assigned to the target so that information regarding the target may be recorded. Thus, it will not be necessary that the target be provided with a machine readable code in order for the target to be used in the sputtering apparatus. Such a target will be used with the operating parameters of the machine set in any manner used prior to the provision of the present invention. Such parameters may be manually entered or set to default settings by the machine control.

If machine readable indicia recognized by the microprocessor program is read from the target, then the target identification code is interpreted by the program and any other information recorded on and read from the target is interpreted. Such other information may be that of the type of material of the target, of special parameter settings, or of the history of the past use of the target. Such past use may be that of the total sputtering energy consumed by the target over its life to date, which can be used as an indication of the state of erosion of the target and thus its surface contour.

The interpreted identity of the target is then compared with information stored in the memory 110 to determine whether the target has been previously used in the apparatus, or to determine whether information regarding the target being installed has been loaded into the memory. If the identity of the target in the memory is not found, an entry of the target identification is made in the memory and the other information, if any, read from the target is stored corresponding storage locations in the memory. In certain embodiments, it may be preferable to read only a target identification code, and perhaps also a target material type, from the target and resort to information pre-stored in the memory along with the target identity code.

Next, the information read from the target and retrieved from the memory relating to the target is checked to determine whether there is sufficient information by which the machine operating parameters can be set so that a sputter coating process can be performed with the newly installed target. If sufficient information is not present, then provision is made for the manual entry of additional information by an operator or for the assignment of program selected or default parameter settings.

If sufficient information is read from the target or retrieved from the memory relating to the target, then the information is interpreted and parameters are set for the operation of the apparatus to perform the sputter coating process. Information of the age of the target and of the target material may be used to set sputtering power levels, for example. The target type and target material may also be used to set maximum power limits.

Once the parameters are set, the process can be initiated. As the process is performed, a clock and calendar may cause the date and time to be recorded in memory, along with the parameter settings by which the process is being performed with the target. Also, information such as the wafer batch numbers and number of substrates being coated may be recorded in memory locations corresponding to the target. Preferably, the time in use and the power levels applied to the target, together with a log of the total energy being applied to the target, are recorded for the target. For each use of the target thereafter, this information is updated for the target in the memory.

Preferably, the stored information is written onto the target medium, or onto a medium which can be affixed to the target. The writing of the information may be done directly in the apparatus with the write head 104a writing onto the writable medium 103a. However, in that the environment in the chamber is generally hostile to many desirable writing techniques, a medium may be written with the updating information at a location remote from the sputtering chamber, in machine readable form, such as by the printing of an optically readable barcode, and the medium affixed to the target upon removal from the chamber.

Having described the invention, it will be apparent to those skilled in the art that the invention may take various forms other than those described herein. Accordingly, the scope of this patent should be limited only by the following claims:

We claim:

1. An expendable target of sputter coating material, having carried thereby to be removable therewith from a sputter coating apparatus, a storage medium having recorded thereon, in machine readable indicia, information relating to a characteristic of the target, and having a target support having the sputter coating material secured thereto, the medium being carried by the support.

2. The target of claim 1 wherein the medium is disposed on the support such that information recorded thereon is destroyed by a process of either removing the target from or securing the target to the support.

3. The target of claim 2 wherein the process by which the target is removed from or secured to the support is a process requiring a heating of the support and the information is so recorded on the medium as to be thermally destructible by the heat of the process.

4. A sputter coating apparatus comprising:
   structure defining a sputter processing chamber;
   an expendable target of sputter coating material supported in the chamber;
   a storage medium secured to the target and having recorded thereon, in machine readable indicia, information relating to a characteristic of the target; and
   means carried by the structure and positioned for reading the information from the medium of the target supported in the chamber.

5. The apparatus of claim 4 wherein the information recorded on the medium is information relating to the identity of the target and the apparatus further comprises means coupled to the reading means for storing information relating to the identity of the target.

6. The apparatus of claim 5 wherein the storing means further includes means for storing information related to the history of the use of the target correlated with the information relating to the identity of the target.

7. The apparatus of claim 6 wherein apparatus further comprises means for performing a sputter coating process with the target in the sputtering chamber and means for updating the history of the target in accordance with the performance of the process therewith.

8. The apparatus of claim 5 wherein the storing means further includes means for storing information related to the time of the use of the target correlated with the information relating to the identity of the target.

9. The apparatus of claim 4 wherein the medium is a read-write medium and the apparatus further comprises means for performing a sputter coating process with the target in the sputtering chamber and for writing information regarding the performance of the process to said medium.

10. The target of claim 4 wherein the information recorded on the medium is information relating to the composition of the target and the apparatus further comprises means for applying sputtering power to the target and means coupled to the reading means for controlling the power applying means in accordance with the information read from the medium.

11. The target of claim 4 further comprising means for performing a sputter coating process with the target in the chamber and means coupled to the reading means for controlling the process in accordance with the information read from the medium.

12. The apparatus of claim 4 further comprising a target nest having the sputter coating material secured thereto, the medium being carried by the nest.

13. The apparatus of claim 12 wherein the medium is disposed on the back of the nest the reading means is positioned behind the nest.

14. The apparatus of claim 12 wherein the process by which the target is removed from or secured to the nest is a process requiring a heating of the nest and the information is so recorded on the medium as to be thermally destructible by the heat of the process.

15. A method of manufacturing a sputter coated article comprising the steps of:
   installing in a sputter coating chamber of a sputter coating apparatus a target of sputter coating material having a medium carrying machine readable information carried thereby;
   reading with a reader carried by the apparatus information from the medium; and
   performing a sputter coating process through the use of the target to deposit a coating of the sputter coating material on an article; and
   storing in a memory information regarding the use of the target, the information including information read from the medium.

16. The method of claim 15 wherein reading step includes the step of reading information relating to the identity of the target.

17. The method of claim 15 wherein reading step includes the step of reading information relating to the history of the use of the target.

18. The method of claim 15 wherein reading step includes the step of reading information relating to the composition of the target.

19. The method of claim 15 further comprising the step of writing the stored information to a medium carried by the target.

20. The method of claim 15 further comprising the steps of writing the stored information to a machine readable medium and affixing the written medium to the target.

21. The method of claim 15 further comprising the steps testing for information recorded on the medium and providing, in response to the test, the option of entering information for the performance of the process with the target.

22. The method of claim 15 wherein the stored information includes information of the energy consumed by the target during the sputtering therewith.

23. The method of claim 22 wherein the stored information of the energy consumed by the target during the sputtering therewith includes information of the power applied to the target and the amount of time during which the power is applied.

* * * * *